(12) United States Patent
Guo (10) Patent No.: US 9,865,321 B2
(45) Date of Patent: Jan. 9, 2018

(54) SPIN TRANSFER MRAM DEVICE WITH REDUCED COEFFICIENT OF MTJ RESISTANCE VARIATION

(71) Applicant: Headway Technologies, Inc., Milpitas, CA (US)

(72) Inventor: Yimin Guo, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/217,148

(22) Filed: Jul. 22, 2016

(65) Prior Publication Data

US 2016/0329087 A1    Nov. 10, 2016

Related U.S. Application Data

(62) Division of application No. 11/881,627, filed on Jul. 27, 2007, now abandoned.

(51) Int. Cl.
*G11C 11/16* (2006.01)

(52) U.S. Cl.
CPC .......... *G11C 11/161* (2013.01); *G11C 11/16* (2013.01); *G11C 11/1655* (2013.01); *G11C 11/1657* (2013.01)

(58) Field of Classification Search
CPC .............. G11C 11/161; G11C 11/1657; G11C 11/1655; G11C 11/16
See application file for complete search history.

(56) References Cited

U.S. PATENT DOCUMENTS

| | | | |
|---|---|---|---|
| 5,695,864 A | 12/1997 | Slonczewski | |
| 6,532,164 B2 | 3/2003 | Redon et al. | |
| 6,829,162 B2 * | 12/2004 | Hosotani | B82Y 10/00 257/E21.665 |
| 6,992,359 B2 | 1/2006 | Nguyen et al. | |
| 7,009,877 B1 | 3/2006 | Huai et al. | |
| 2005/0189574 A1 * | 9/2005 | Nguyen | B82Y 25/00 257/295 |
| 2005/0195649 A1 | 9/2005 | Nickel et al. | |
| 2006/0202244 A1 | 9/2006 | Ju et al. | |
| 2006/0221680 A1 | 10/2006 | Hosotani | |

OTHER PUBLICATIONS

"Direct-Current Induced Dynamics in Co90Fe10/Ni80Fe20 Point Contacts," by W. H. Rippard et al., Physical Review Letters, vol. 92, No. 2, Jan. 16, 2004, pp. 1-4.

(Continued)

*Primary Examiner* — Douglas King
(74) *Attorney, Agent, or Firm* — Saile Ackerman LLC; Stephen B. Ackerman (57) ABSTRACT

We describe the manufacturing process for and structure of a CPP MTJ MRAM unit cell that utilizes transfer of spin angular momentum as a mechanism for changing the magnetic moment direction of a free layer. The cell is formed of a vertically or horizontally series connected sequence of N sub-cells, each sub-cell being an identical MTJ element. A statistical population of such multiple sub-cell unit cells has a variation of resistance that is less by a factor of $N^{-1/2}$ than that of a population of single sub-cells. As a result, such unit cells have an improved read margin while not requiring an increase in the critical switching current.

1 Claim, 5 Drawing Sheets

(56) References Cited

OTHER PUBLICATIONS

"Spin-current interaction with a monodomain magnetic body: A model study," by J. Z. Sun, Physical Review B, vol. 62, No. 1, Jul. 1, 2000, pp. 570-578.
"Current-driven excitation of magnetic multilayers," by J. C. Slonczewski, Elsevier, Journal of Magnetism and Magnetic Materials 159 (1996) L1-7, Jun. 1996.

* cited by examiner

SPIN TRANSFER MRAM DEVICE WITH REDUCED COEFFICIENT OF MTJ RESISTANCE VARIATION

This is a Divisional Application of U.S. patent application Ser. No. 11/881,627, filed on Jul. 27, 2007, which is herein incorporated by reference in its entirety, and assigned to a common assignee.

BACKGROUND OF THE INVENTION

1. Field of the Invention

This invention relates generally to a current perpendicular to plane random access memory (CPP-MRAM) cell formed as a magnetic tunneling junction (MTJ) and using a spin transfer effect with enhanced spin torque.

2. Description of the Related Art

The conventional magnetic tunneling junction (MTJ) device is a form of ultra-high magnetoresistive device in which the relative orientation of the magnetic moments of parallel, vertically separated, upper and lower magnetized layers controls the flow of spin-polarized electrons tunneling through a very thin dielectric layer (the tunneling barrier layer) formed between those layers. When injected electrons pass through the upper layer they are spin polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of multi-state resistor, since different relative orientations (e.g. parallel and antiparallel) of the magnetic moments will change the magnitude of a current passing through the device. In a common type of device configuration (spin filter), one of the magnetic layers has its magnetic moment fixed in direction (pinned) by exchange coupling to an antiferromagnetic layer, while the other magnetic layer has its magnetic moment free to move (the free layer). The magnetic moment of the free layer is then made to switch its direction from being parallel to that of the pinned layer, whereupon the tunneling current is large, to being antiparallel to the pinned layer, whereupon the tunneling current is small. Thus, the device is effectively a two-state resistor. The switching of the free layer moment direction (writing) is accomplished by external magnetic fields that are the result of currents passing through conducting lines adjacent to the cell.

Figure 1:
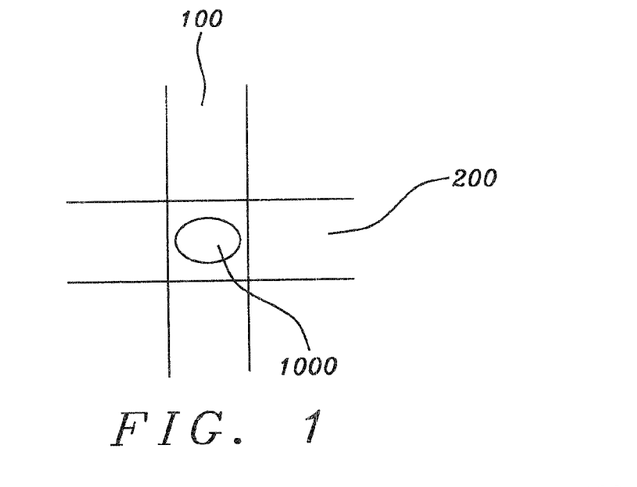
FIG. 1 is a schematic representation of a prior-art MTJ MRAM device located at the junction of word and bit lines.

FIG. 1 is a highly schematic drawing showing an overhead view of a conventional MRAM cell between orthogonal word (200) and bit (100) lines. The cell (1000) is drawn with a slightly elliptical horizontal cross-section because such a shape produces a magnetic anisotropy within the free layer that assists its magnetic moment in retaining a thermally stable fixed position after switching fields have been turned off. The fields produced by currents in each of the two lines are between about 30 to 60 Oersteds in magnitude. According to the diagram, the word line field will be along the hard axis of the cell, the bit line field will be along the easy axis (the longer axis of the ellipse).

The use of magnetic fields externally generated by current carrying lines (as in FIG. 1) to switch the magnetic moment directions becomes problematic as the size of the MRAM cells decreases and, along with their decrease, so does the width of the current carrying lines. The smaller width lines require greater current densities to produce the necessary switching fields on the MTJ elements, greatly increasing power consumption.

For this reason, a new type of magnetic device, called a spin transfer device and described by Slonczewski, (U.S. Pat. No. 5,695,164) and by Redon et al. (U.S. Pat. No. 6,532,164) has been developed and seems to eliminate some of the problems associated with the excessive power consumption necessitated by external switching fields. The spin transfer device shares some of the operational features of the conventional MTJ cell described above, except that the switching of the free layer magnetic moment is produced by the spin polarized current itself. In this device, unpolarized conduction electrons passing through a first magnetic layer having its magnetic moment oriented in a given direction (such as the pinned layer) are preferentially polarized by their passage through that layer by a quantum mechanical exchange interaction with the polarized bound electrons in the layer. Such a polarization can occur to conduction electrons that reflect from the surface of the magnetized layer as well as to those that pass through it. When such a stream of polarized conduction electrons subsequently pass through a second magnetic layer whose polarization direction is not fixed in space (such as the free layer), the polarized conduction electrons exert a torque on the bound electrons in the magnetic layers which, if sufficient, can reverse the polarization of the bound electrons and, thereby, reverse the magnetic moment of the magnetic layer. The use of a spin-polarized current internal to the cell to cause the magnetic moment reversal requires much smaller currents than those required to produce an external magnetic field from adjacent current carrying lines to produce the moment switching. Recent experimental data (W. H. Rippard et al., Phys. Rev. Lett., 92, (2004)) confirm magnetic moment transfer as a source of magnetic excitation and, subsequently, magnetic moment switching. These experiments confirm earlier theoretical predictions (J. C. Slonczewski, J. Magn. Mater. 159 (1996) LI, and J. Z. Sun, Phys. Rev. B., Vol. 62 (2000) 570). These latter papers show that the net torque, Γ, on the magnetization of a free magnetic layer produced by spin-transfer from a spin-polarized DC current is proportional to:

$$\Gamma = s \, n_m \times (n_s \times n_m), \quad (1)$$

Where s is the spin-angular momentum deposition rate, $n_s$ is a unit vector whose direction is that of the initial spin direction of the current and $n_m$ is a unit vector whose direction is that of the free layer magnetization and x symbolizes a vector cross product. According equation (1), the torque is maximum when $n_s$ is orthogonal to $n_m$.

Figure 2:
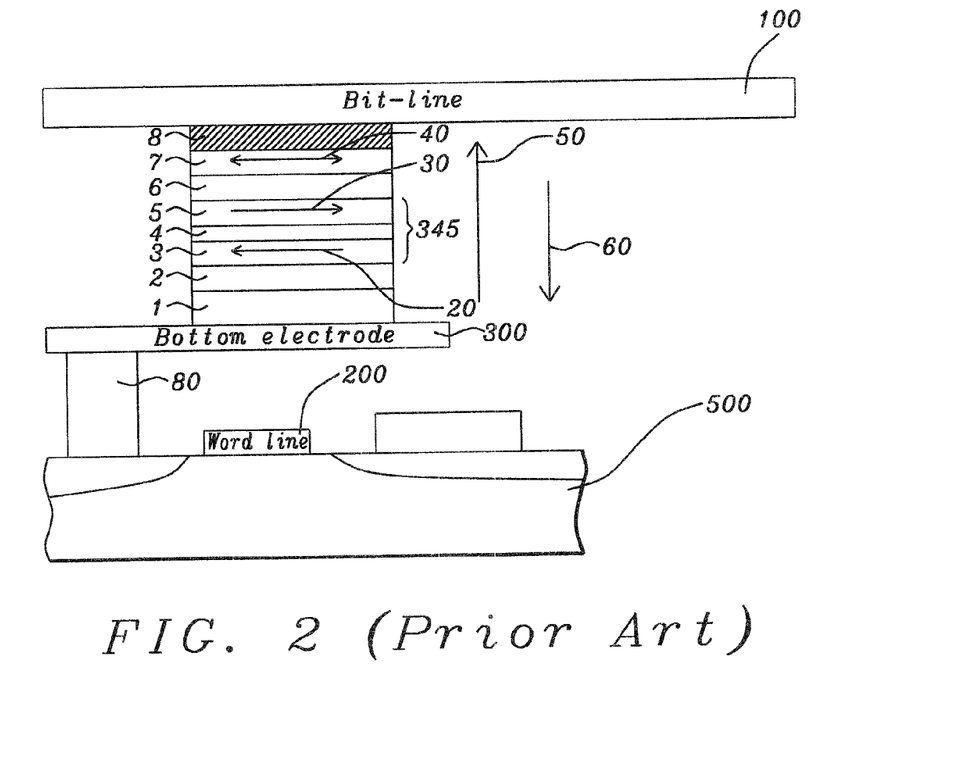
FIG. 2 is a schematic cross-sectional view of a typical prior art spin-transfer MRAM device formed using a single MTJ element.

Referring to FIG. 2, there is shown a schematic illustration of an exemplary prior art MTJ element being contacted from above by a bit line (100) and from below by a bottom electrode (200). Moving vertically upward, there is shown a seed layer (1), an antiferromagnetic pinning layer (2), a synthetic antiferromagnetic (SyAF) pinned reference layer (345), consisting of a first ferromagnetic layer (3), a non-magnetic spacer layer (4) and a second ferromagnetic layer (5), a non-conducting tunneling barrier layer (6), a ferromagnetic free layer (7) and a non-magnetic capping layer (8). Arrows, (20) and (30), indicate the antiparallel magnetization directions of the two ferromagnetic layers (3) and (5) of the SyAF pinned layer (345). The double-headed arrow (40) in layer 7 indicates that this layer is free to have its magnetic moment directed in either of two directions.

Referring again to FIG. 2 it is noted that when a critical current (arrow (50) is directed from bottom to top (layer (1) to layer (8)), the free layer magnetization (40) would be switched to be opposite to the direction of the reference layer's magnetization (30) by the spin-transfer torque. This puts the MTJ cell into its high resistance state.

Conversely, if the current is directed from top to bottom, the free layer magnetization (40) would be switched, by torque transfer of angular momentum, to the same direction as that of the pinned reference layer (30), since the conduction electrons have passed through that layer before entering the free layer. The MTJ element is then in its low resistance state.

Referring again to FIG. 2, there is shown some additional circuitry, specifically a transistor (500) to inject current into the cell element whenever the cell element is selected to be written upon. The transistor is electrically connected to the cell through a conducting via (80) which allows a current to pass vertically between the bottom electrode (300) and the bit line (100). The word line (200), which can contact the transistor gate activates the transistor so as to inject the writing current. In this way one can create a single spin-RAM memory cell that utilizes the spin transfer effect (denoted hereinafter as an STT-RAM) for switching an MTJ type element. In this paper, we will use the term "element" to describe the basic MTJ structure comprising a tunneling barrier layer sandwiched between ferromagnetic fixed and free layers. We shall use the term "memory cell" to denote the combination of the MTJ element incorporated within circuitry that permits the element to be written on and read from. The word line provides the bit selection (i.e., selects the particular cell which will be switched by means of a current passing through it between the bit line and the source line) and the transistor provides the current necessary for switching the MTJ free layer of the selected cell. Although it is not shown in this simplified figure, the cell is read by applying a bias voltage between the bit line and source line, thereby measuring its resistance and comparing that resistance with a standard cell in the circuit. It is to be noted that large cell arrays are subject to difficulties that arise from statistical variations in the magnetic and electrical properties of each cell. For example, to decide whether a cell is in its high or low resistance state, its resistance must be compared to that of a reference cell that is in a known resistance state. However, statistical variations in the high and low resistance values of the array cells and the reference cells often make it possible to incorrectly interpret the resistance value of a cell. For this reason, the maximum variations of the resistance values of cells must fall within a "read margin" (of error) so that a correct interpretation of a resistance value is made in all cases. In fact, it is the goal of the present invention to provide a method of improving this read margin without sacrificing any of the features of the memory cell.

The critical current for spin transfer switching, $I_c$, is generally a few milliamperes for a 180 nm sub-micron MTJ cell (of cross-sectional area A approximately A=200 nm×400 nm). The corresponding critical current density, $J_c$, which is $I_c/A$, is on the order of several $10^7$ Amperes/cm$^2$. This high current density, which is required to induce the spin transfer effect, could destroy the insulating tunneling barrier in the MTJ cell, such as a layer of AlOx, MgO, etc.

During the reading of data, a small current flows across the MTJ cell and its resistance is compared with a pre-written MTJ cell (not shown) called a reference cell, to determine whether the cell being read is in a high or low resistance state. Typically, the reading margin is determined by the ratio between the magneto-resistive ratio, dR/R (the difference between the maximum and minimum resistance of the cell divided by its maximum resistance) and the coefficient of resistance variance, $\sigma/\mu$, (the ratio between resistance standard deviation $\sigma$ and resistance mean value $\mu$).

Normally, the write current density required to switch the direction of the free layer magnetization is mainly determined by the free layer magnetic moment, damping ratio and spin-angular momentum deposition rate, which depend on the MTJ film materials and their quality. As the MTJ device is microminiaturized to nanometer scale dimensions, the write current density is unchanged, giving a much smaller write current which is scalable to the shrinking MTJ cell dimensions. Hence, power consumption in the device is reduced.

However, as the MTJ cell dimensions become smaller and smaller, the MTJ resistance variation rapidly increases. For example. using the same MTJ film materials and deposition processes, the coefficient of MTJ resistance variance is found to be inversely proportional to the square root of each MTJ junction area. This makes the reading process very difficult, even impossible, without a great increase in the magneto-resistive ratio dR/R. To address this problem, a spin transfer MRAM structure with a special arrangement of MTJ cells is proposed to reduce the resistance variance.

Various combinations of MTJ cells can be found in the prior art. Huai et al. (U.S. Pat. No. 7,009,877) shows an MTJ element and a spin transfer element arranged vertically. In this invention they use an MTJ and a CPP-GMR immediately connected together to achieve a low write switching current. They also include the combination of two different MTJ cells, one with a smaller dR/R than the other, to achieve a low write switching current.

Hosotani (US Patent Application 2006/0221680) and Ju et al. (US Patent Application 2006/0202244) and Nickel et at (US Patent Application 2005/0195649) all disclose two MTJ elements connected in series and are used to write two bits per cell. In these applications two different MTJ cells are connected together with different anisotropy directions in their layers, obtained either by different shape orientations or different magnetic materials.

Nguyen et al (U.S. Pat. No. 6,992,359) disclose a method for reducing write current density for spin transfer by using a free layer having a high perpendicular magnetic anisotropy. The purpose is to achieve a low write switching current for a spin-transfer MRAM.

None of the above prior art discuss a method for reducing resistance variation, which will help the reading process for a spin-transfer MRAM. To address this problem, we propose a spin-transfer MRAM cell structure with a special arrangement of MTJ elements designed to reduce the resistance covariance. In this arrangement, electric current flows across two or more identical MTJ elements (denoted "sub-cells") substantially identical in structure to the MTJ element shown in FIG. 2. The configuration will be described in greater detail with reference to FIGS. 3a and 3b below.

During the writing process, the required critical current for switching the magnetization direction of an MTJ free layer is the same for all MTJ sub-cells connected in series. Thus, the same size current-supplying local transistor is required as would be needed for writing a single MTJ element. During the reading process, if each individual sub-cell has a mean resistance value $R_p$ and if the resistance values are distributed with a standard deviation $\sigma$, the mean value of the total resistance in one MTJ MRAM cell unit containing N sub-cells is the product $(N)(R_p)$, while the standard deviation of total resistance of many such MRAM units is the product $\sigma(N)^{1/2}$. Therefore, given that the coefficient of resistance of one MTJ sub-cell is $\sigma/R_p$, the coefficient of resistance among the MTJ MRAM units is the product $(N)^{-1/2} (\sigma/R_p)$. In other words, the coefficient of resistance is reduced by a factor of $(N)^{1/2}$, yielding a greatly increased reading margin.

SUMMARY OF THE INVENTION

A first object of this invention is to provide an MRAM device configuration that provides a greatly increased read margin while not requiring any increase in critical current or local transistor size.

A second object of this invention is to provide a MRAM device configuration that includes a plurality of series-connected MTJ sub-cells in which the coefficient of resistance of the configuration as a whole is reduced as compared with the coefficient of resistance of the individual sub-cells.

These objects are achieved by an MRAM design in which N (where N is equal to or greater than 2) MTJ sub-cells of identical size are connected in series so as to function as a single unit in a spin transfer MRAM structure. Thus, the passage of a critical current simultaneously switches the free layer magnetization of the free layer in each sub-cell. This arrangement requires the same write current or the same local transistor size, yet it gives a greatly increased reading margin as a result of a coefficient of resistance variation that is reduced by a factor of $N^{-1/2}$. Thus, in a given unit cell of a multi-cell array, each unit cell will comprise two or more identical sub-cells connected in series between a local transistor and a bit line. The sub-cells may be sequentially connected either in a horizontal configuration, in which adjacent series connected cells are at the same vertical level, or a vertical configuration in which sequentially adjacent cells are at different vertical levels. In each configuration, as will be shown in greater detail below, the bottom electrode of the first sub-cell is connected to the local transistor, the top electrode of the last sub-cell is connected to the bit line and any adjacent intermediate sub-cells are connected by electrically contacting a top electrode to a bottom electrode.

BRIEF DESCRIPTION OF THE DRAWINGS

FIG. 5a-FIG. 5d are schematic representations illustrating the fabrication steps required to form an array of sub-cells such as described in FIG. 3a.

DESCRIPTION OF THE PREFERRED EMBODIMENTS

The preferred embodiment of the present invention is an MRAM device (a single unit cell or an array of such cells) of the spin-transfer variety, having as the basic components of each unit cell CPP-MTJ elements. These elements are configured as a series-connected sequence of MTJ sub-cells so that the critical switching current is the same as for a single cell yet the variation of resistance is significantly reduced.

Figure 3A:
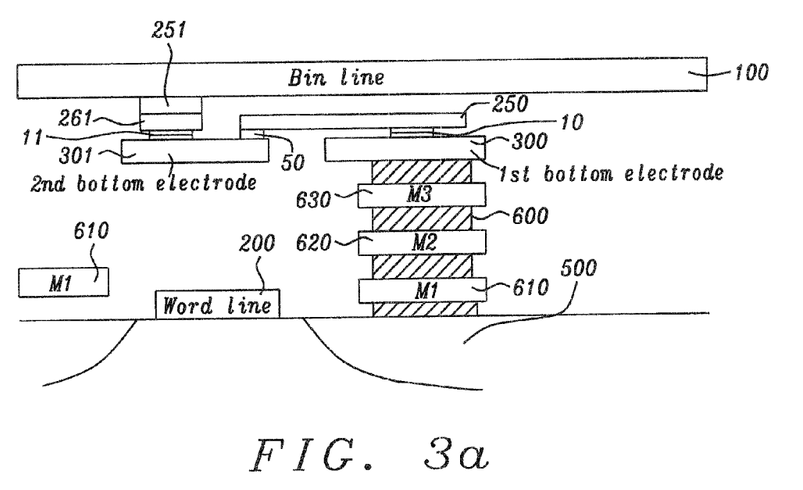
FIG. 3a and FIG. 3b are schematic representations of two preferred embodiments of the present invention using a plurality of MTJ sub-cells that are connected either horizontally or vertically.

Referring to FIG. 3a, there is shown a first embodiment of this invention. In this embodiment a plurality of N sub-cells, where N is an integer greater than 1 (only two (10), (11) being shown for simplicity) are formed in a horizontal series connected sequence. Looking downward from the top of the diagram, there is shown a horizontally extending bit line (100). At the bottom of the diagram is shown (highly schematically) a current providing transistor (500). A word line (200) that extends perpendicularly to the plane of the figure and, correspondingly, transverse to the bit line, substantially contacts the gate of the transistor. A conducting via (600) is shown extending upward through three exemplary layers (610), (620), (630) of metallization (levels of the circuit integration along which electrical connections are made) to ultimately contact the bottom electrode (300) of a first MTJ sub-cell (10). The first sub-cell has a top electrode (250) which extends horizontally to electrically contact the bottom electrode (301) of a second sub-cell (11). The contact from (250) to the bottom electrode (301) typically requires a conducting via (50). The second sub-cell (11) has a top electrode (251), that electrically contacts the bit line (100) by passing through a via (261), thereby completing the series circuit through the two sub-cells. If there were more than two sub-cells, it would be the top electrode of the final sub-cell that would contact the bit line. In any given number of such horizontally connected sub-cells, the passage of a critical current from the transistor to the bit line would simultaneously switch the magnetization direction of each free layer in each sub-cell. The critical switching current of this arrangement is the same as for a single cell, yet the coefficient of resistance variation is reduced by a factor of $2^{1/2}$ (or $N^{1/2}$ for N sub-cells).

Figure 3B:
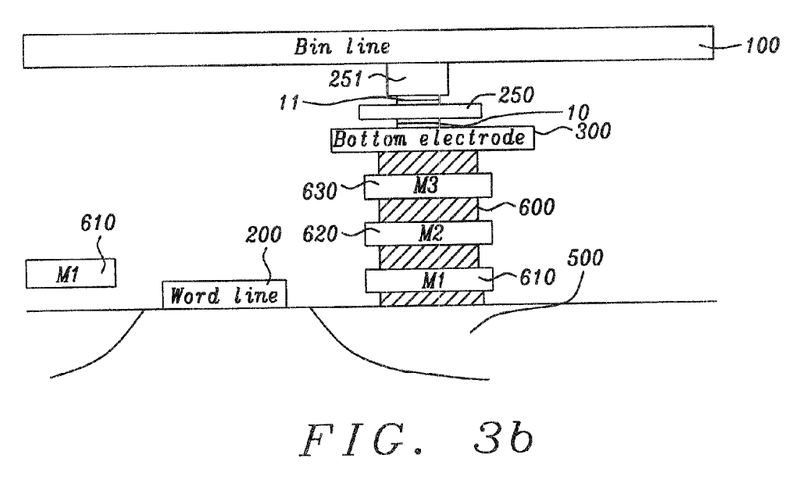

Referring now to FIG. 3b, there is shown a second embodiment of this invention in which the series connection of two exemplary sub-cells is in the vertical direction. As in FIG. 3a, there is shown a bit line (100) and a current providing transistor (500). A word line (200) extends out of the figure plane and contacts the gate of the transistor. A conducting via (600) extends vertically upward through three exemplary metallization layers (610), (620), (630), whereupon it electrically contacts a bottom electrode (300) of the first sub-cell (10). The top electrode (250) of the first sub-cell serves as a bottom electrode of a second sub-cell (11) and the top electrode (251) of the second cell electrically contacts the bit line (100) to complete the circuit between the transistor and the bit line. Like the first embodiment, the critical switching current of this arrangement is the same as for a single cell, yet the coefficient of resistance variation is reduced by a factor of $2^{1/2}$ (or $N^{1/2}$ for N sub-cells). In any given number of such vertically connected sub-cells, the passage of a critical current from the transistor to the bit line would simultaneously switch the magnetization direction of each free layer in each sub-cell.

Figure 4A:
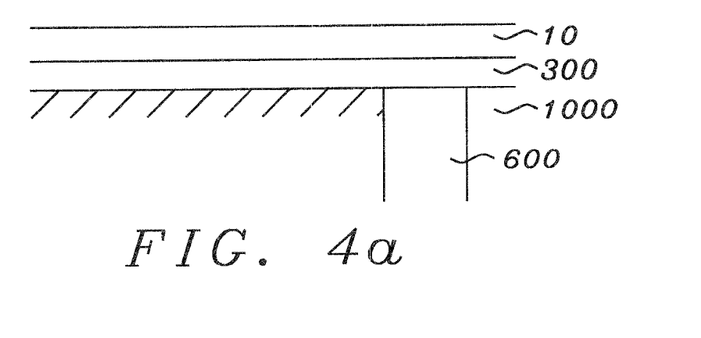
FIG. 4a-4f are schematic representations illustrating the fabrication steps required to form an array of sub-cells such as described in FIG. 3b.

Referring now to FIG. 4a, there is shown, schematically, a typical fabrication process of this second embodiment, in which the sub-cells are series connected in a vertical configuration. In this process there is first formed on a substrate (1000) a first bottom electrode (300) on which is formed a first MTJ element film stack (10) that will subsequently be patterned to become the first sub-cell. The substrate may already contain a conducting via (600) that connects to a transistor in a lower layer of the fabrication. This via will not be shown in subsequent drawings but its presence is understood. Note, in this terminology the film stack refers to the succession of vertically stacked layers that, when horizontally patterned, will become an MTJ sub-cell. The vertical structure of the stack is the same as the vertical structure of the MTJ cell shown in FIG. 2, so, for clarity, the stack will be shown as a layer (10) without structure.

The horizontal extent of the film stack as well as the horizontal extent of the bottom electrode is sufficient to form, by lithographic patterning to a desired horizontal cross-sectional area, a plurality of sub-cells that will be connected to form a sequentially series connected unit MRAM cell.

As indicated by the cell structure in FIG. 2, the film stack comprises, in vertical ascending order, a seed layer (1), an antiferromagnetic pinning layer (2), a pinned layer (345), that is typically a synthetic (SyAP) structure comprising ferromagnetic layers (3) and (5) separated by a non-magnetic coupling layer (4), a tunneling barrier layer (6), a ferromagnetic free layer(7) and a capping layer (8). These layers are formed using conventional techniques that are known in the art.

Figure 4B:
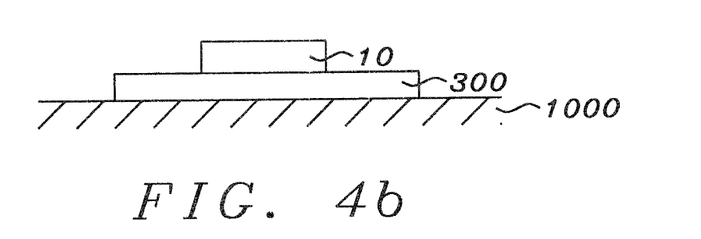

Referring to FIG. 4b, there is shown the bottom electrode (300) and film stack (10) having been patterned by photolithography and etching processes. In this process the film stack is provided with the desired horizontal cross-section, such as an elliptical cross-section. We shall retain the same numbering for the patterned stack and electrode as for the unpatterned layers.

Figure 4C:
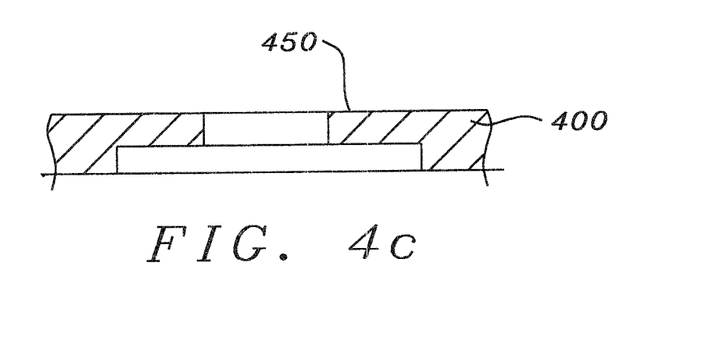

Referring to FIG. 4c, there is shown the patterned stack surrounded by a dielectric refilled layer (400) that has been planarized by, for example, a CMP process, so that the top of the dielectric and the top of the patterned stack share a common co-planar surface (450).

Figure 4D:
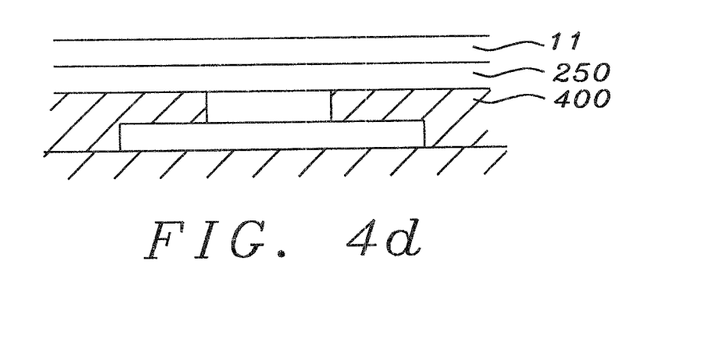

Referring to FIG. 4d, there is shown the deposition of the second bottom electrode (250), which is also the top electrode of the already deposited sub-cell. A second film stack (11), identical to the first film stack, is formed on the second bottom electrode.

Figure 4E:
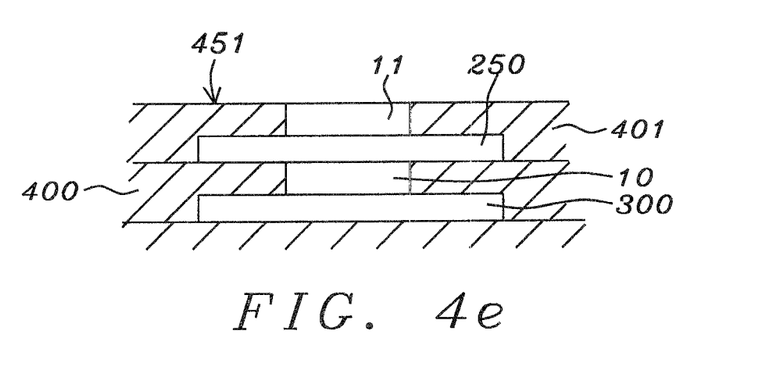

Referring to FIG. 4e, there is shown the patterning of the second film stack (11) followed by the deposition of a second dielectric refilling layer (401) and its planarization to form a co-planar surface (451) with the top of the second sub-cell (11) (the patterned stack).

Figure 4F:
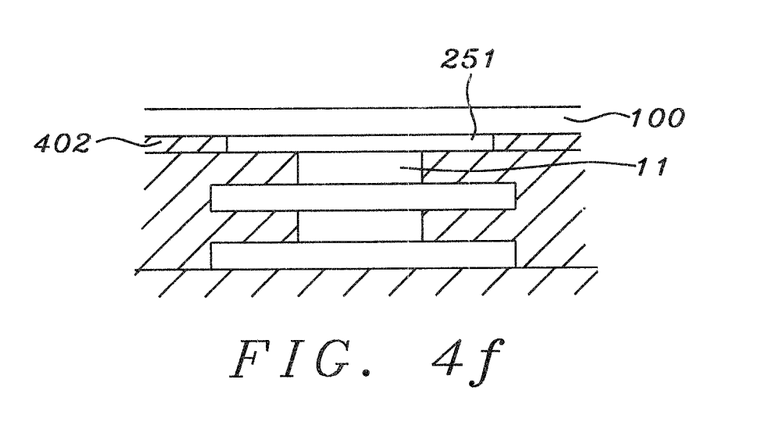

Referring to FIG. 4f, there is now shown the deposition of the second top electrode (251), on surface (451) of the previous FIG. 4e, followed by deposition of a surrounding refill dielectric (402), its planarization, and the formation of a bit line (100) on the planarized surface.

It should be understood by those skilled in the art that the steps outlined above in FIG. 4a to FIG. 4f can be repeated in precisely the same manner to form a succession of sub-cells of any desired number, with N sub-cells, where N is an integer greater than 1, denoting the general fabrication size.

Figure 5A:
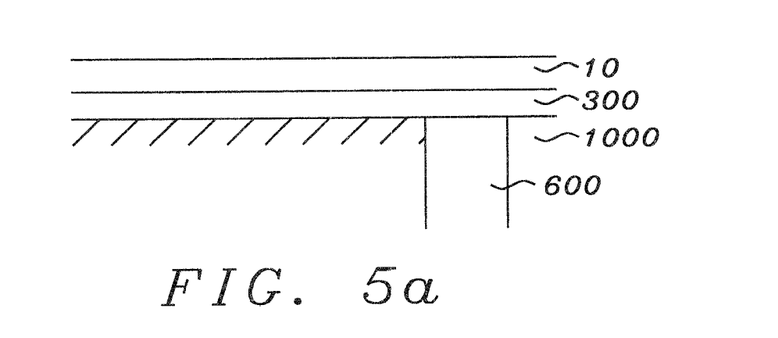

Referring now to FIG. 5a, there is shown a first step in a process that can fabricate the first embodiment of this invention, namely a succession of linearly connected sub-cells formed in a horizontal configuration. Like the vertical configuration described in FIG. 4a, the first step in the horizontal configuration is the deposition of a bottom electrode layer (300) and a film stack (10).

Figure 5B:
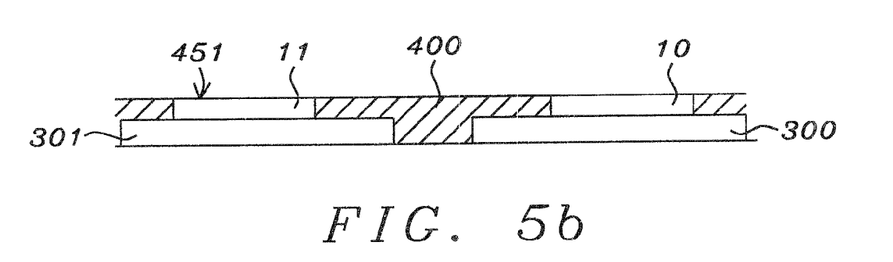

Referring to FIG. 5b, there is shown the patterning of two horizontally separated sub-cells (10) and (11) on bottom electrodes (300) and (301) respectively. There is also shown the deposition and planarization of a dielectric refill layer (400) to form planar surface (451) including the upper surfaces of cells (10) and (11). In the general case, N horizontally separated MTJ sub-cells and their bottom electrodes would be formed, where N is an integer greater than 1.

Figure 5C:
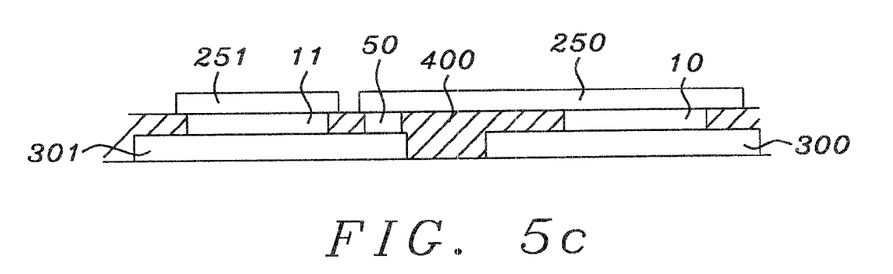
Figure 5D:
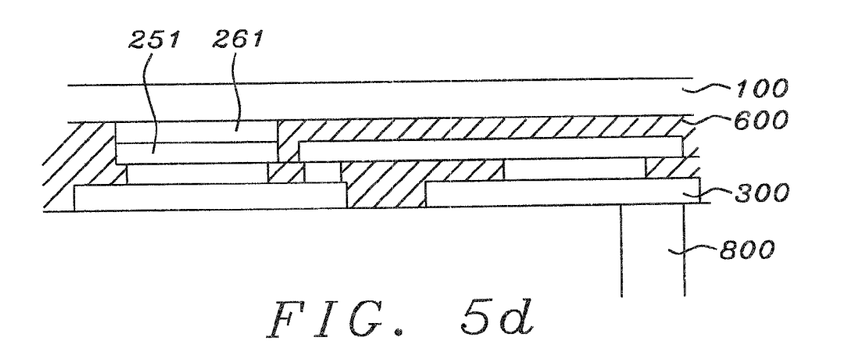

Referring to FIG. 5c, there is shown the formation of a conducting via (50) through the planarized layer (400) and the formation and patterning of two top electrodes (250) and (251) over the planarized surface ((451) in FIG. 5b). In the case of N MTJ sub-cells, the top electrode layer would be patterned into N sections, with each of N−1 sections electrically connecting an MTJ sub-cell to the bottom electrode of a neighboring adjacent sub-cell through a conducting via.

Referring to FIG. 5c1, there is shown the formation of a surrounding dielectric layer (600). The top surface of this layer will be planarized to allow the formation of a bit line (100) and the top via (261) over the top electrode (251) of the last (the Nth) MTJ sub-cell will be vertically extended so that it allows the top electrode (251) to electrically contact by the bit line. It is understood that bottom electrode (300) can contact via (800) shown so that contact to a transistor (not shown) can be made. This connection is shown in FIG. 3a.

As is finally understood by a person skilled in the art, the preferred embodiments of the present invention are illustrative of the present invention rather than limiting of the present invention. Revisions and modifications may be made to methods, materials, structures and dimensions employed in forming and providing a CPP MTJ MRAM cell device using transfer of spin angular momentum formed as a series connected sequence of sub-cells, while still forming and providing such a device and its method of formation in accord with the spirit and scope of the present invention as defined by the appended claims.

What is claimed is:

1. A spin transfer MRAM unit cell having a reduced statistical resistance variance comprising: a local transistor capable of providing a critical switching current to an MTJ cell element; a word line, formed in a first horizontal plane, contacting said transistor and capable of activating said transistor so that a current is produced; a bit line, formed in a second horizontal plane that is parallel to and vertically separated from said first horizontal plane, wherein said bit line is directed transversely to said word line; a configuration of N vertically adjacent, statistically independent and identical MTJ sub-cells, wherein N is an integer greater than 1, said configuration including a first sub-cell and a last sub-cell and said configuration being electrically connected in linear series, wherein all MTJ sub-cells have the same multi-layer structure with the same geometry and each sub-cell comprises, in a vertically stacked configuration, a bottom electrode, a pinning layer, a synthetic pinned layer, a tunneling barrier layer, a free layer and an upper electrode and wherein the bottom electrode of said first sub-cell of said N sub-cells electrically contacts said local transistor, and the top electrode of said last sub-cell of said N sub-cells electrically contacts said bit line, and wherein said top electrode and said bottom electrode of each pair of vertically adjacent sub-cells, other than the bottom electrode of said first sub-cell and said top electrode of said last sub-cell, are in electrical contact to form a single shared electrode, control circuitry configured to provide a critical current capable of simultaneously switching the magnetization of said free layer in each sub-cell of said N sub-cells vertically between said transistor and said bit line and whereby the statistical resistance variations within the first to Nth sub-cells of said unit cell when formed as said configuration of statistically independent and identical MTJ sub-cells is less by a factor of $N^{1/2}$ than the resistance variations within a similar statistical population of a unit cell having equivalent properties and formed of a single sub-cell.

* * * * *